United States Patent [19]

Honig

[11] Patent Number: 4,613,765
[45] Date of Patent: Sep. 23, 1986

[54] SERIES-COUNTERPULSE REPETITIVE-PULSE INDUCTIVE STORAGE CIRCUIT

[75] Inventor: Emanuel M. Honig, Los Alamos, N. Mex.

[73] Assignee: The United States of America as represented by the United States Department of Energy, Washington, D.C.

[21] Appl. No.: 617,658

[22] Filed: Jun. 5, 1984

[51] Int. Cl.[4] .................. H03K 17/72; H03K 3/352
[52] U.S. Cl. .................. 307/252 K; 307/268; 307/252 M; 328/67
[58] Field of Search .......... 307/252 K, 252 L, 252 M, 307/268; 328/67

[56] References Cited

U.S. PATENT DOCUMENTS 3,146,356  8/1964  Kidwell et al. ............. 307/252 M
3,614,586 10/1971  King ........................... 307/252 M
3,963,945  6/1976  Colyn ......................... 307/252 K Primary Examiner—John Zazworsky
Attorney, Agent, or Firm—Samuel M. Freund; Paul D. Gaetjens; Judson R. Hightower

[57] ABSTRACT

A high-power series-counterpulse repetitive-pulse inductive energy storage and transfer circuit includes an opening switch, a main energy storage coil, and a counterpulse capacitor. The load pulse is initiated simultaneously with the initiation of the counterpulse which is used to turn the opening switch off. There is no delay from command to output pulse. During the load pulse, the counterpulse capacitor is first discharged and then recharged in the opposite polarity with sufficient energy to accomplish the load counterpulse which terminates the load pulse and turns the load switch off. When the main opening switch is triggered closed again to terminate the load pulse, the counterpulse capacitor discharges in the reverse direction through the load switch and through the load, causing a rapid, sharp cutoff of the load pulse as well as recovering any energy remaining in the load inductance. The counterpulse capacitor is recharged to its original condition by the main energy storage coil after the load pulse is over, not before it begins.

6 Claims, 2 Drawing Figures

SERIES-COUNTERPULSE REPETITIVE-PULSE INDUCTIVE STORAGE CIRCUIT

This invention is the result of a contract with the Department of Energy (Contract No. W-7405-ENG-36).

BACKGROUND OF THE PRESENT INVENTION

The present invention relates generally to a high-power pulsing circuit and more particularly to a repetitive-pulse inductive energy storage and transfer circuit.

Many applications requiring power in the form of a train of high-power pulses are emerging from major programs within the Department of Energy and Department of Defense communities. Included among these applications are high-repetition-rate particle accelerators and lasers, pulsed microwave generators, high-power high-resolution radar, and induction heating systems. When the pulse-train duty factor (pulse width/pulse interval) is low, energy storage capability is needed to provide proper power conditioning. Inductive energy storage is attractive for these systems because it has both a high energy storage density and a fast discharge capability. However, to transfer energy from a coil or inductor to a load, an opening switch must be used to interrupt the current and insert the load into the circuit. The opening switch must carry the large coil current during the storage time, interrupt the current, and then withstand the high voltage generated by the coil current flowing through the load. The opening switch problem is difficult enough for single-shot operation, but it becomes almost impossible when repetitive operation is required.

Two types of repetitive pulse operation of inductive storage systems have appeared in the literature. The first uses a rotary, mechanical opening switch to generate pulses at moderate power levels and repetition rates (about 1 MW and 60 pulses per second (pps), respectively) with a low impedance load, see D. Bauer and J. Barber, "A Repetitive Current Interrupter for an Inductive Energy Storage Circuit," Proc. 4th IEEE Pulsed Power Conf., Albuquerque, N.M. June 6–8, 1983, IEEE Pub. No. 83CH1908-3, pp. 98–101. Due to its mechanical construction and nature of operation (sliding brushes), the rotary switch has essentially no potential for meeting the high-power, high-repetition-rate pulse requirements of the DOE and DoD applications discussed earlier.

The second uses an explosive opening switch and a string of fuses to produce a train of 3–5 pulses at a peak power level of 2.6 GW and a pulse repetition rate of about 50 kpps, see R. D. Ford and I. M. Vitkovitsky, "Inductive Storage Pulse-Train Generator," Proc. 13th Pulse Power Modulator Symp., Buffalo, N.Y., June 20–22, 1978, IEEE Pub. No. 78CH1371-4-ED, pp. 284–288. The need to replace the explosive opening switch and fuses between each burst of pulses severely restricts the use of this method, limiting it primarily to the research laboratory.

A companion case, "Reversing-Counterpulse Repetitive-Pulse Inductive Storage Circuit," Ser. No. 617,653, was filed on June 5, 1984 by Emanuel M. Honig, and will be distinguished hereinbelow.

Therefore it is an object of the present invention to provide a high-power repetitive-pulse inductive energy storage and transfer circuit.

It is another object of the present invention to provide an efficient, high-power inductive energy storage and transfer-circuit having a reusable opening switch.

It is another object of the present invention to provide a repetitive-pulse inductive and energy storage and transfer system having fewer components and less cost and complexity than would be required in a bridge circuit type inductive energy storage system.

It is another object of the present invention to provide a repetitive-pulse inductive energy storage and transfer circuit having no delay from the time the counterpulse is initiated to the time the output pulse is initiated.

It is still another object of the present invention to provide a repetitive-pulse inductive energy storage and transfer circuit in which the load pulse is initiated by counterpulsing the main opening switch off and in which the load pulse is terminated by counterpulsing the load switch off.

SUMMARY OF THE INVENTION

To achieve the foregoing and other objects, and in accordance with the purpose of the present invention, as embodied and broadly described herein, the repetitive high-power pulse circuit of the present invention includes a main opening switch, an energy storage coil, and a counterpulse capacitor. The load pulse is initiated simultaneously with the initiation of the counterpulse which is used to turn the opening switch off. There is no delay from command to output pulse. During the load pulse, the counterpulse capacitor is first discharged and then recharged in the opposite polarity with sufficient energy to accomplish the subsequent load counterpulse which terminates the load pulse and turns the load switch off. When the main opening switch is triggered closed again to terminate the load pulse, the counterpulse capacitor discharges in the reverse direction through the load switch and through the load, causing a rapid, sharp cutoff of the load pulse as well as recovering any energy remaining in the load inductance. The counterpulse capacitor is recharged to its original condition by the main energy storage coil after the load pulse is over, not before it begins, as is the case in the companion patent application Ser. No. 617,653, supra.

An advantage of the present invention is that it uses inductive energy storage having both a high energy storage density and a fast discharge capability in a high-power repetitive pulse circuit.

Another advantage of the present invention is that it enables repetitive counterpulse operation without using a bridge arrangement; see, e.g., U.S. Pat. No. 4,473,875, thereby eliminating the need for two switches and resulting in significant cost savings and some size reduction of inductive storage systems for large-scale repetitive-pulse applications.

Another advantage of the present invention is that there is no time delay from initiation of the counterpulse to initiation of the load pulse.

Another advantage of the present invention is that, when the main opening switch is closed to terminate the output pulse, the counterpulse capacitor discharges through the load in such a manner as to cause a rapid, sharp cutoff of the load pulse by counterpulsing the load switch off as well as to enable the recovery of any energy remaining in the load inductance.

BRIEF DESCRIPTION OF THE DRAWINGS

The accompanying drawings, which are incorporated in and form a part of the specification, illustrate the embodiment of the present invention and, together with the description, serve to explain the principles of the invention. In the drawings.

DETAILED DESCRIPTION OF A PREFERRED EMBODIMENT OF THE INVENTION

Figure 1:
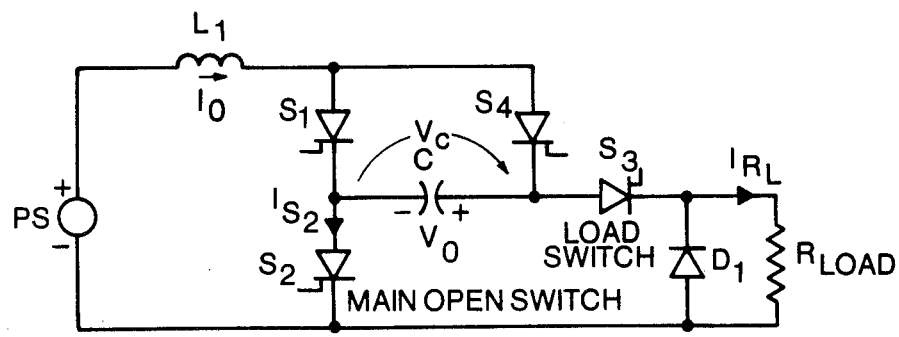
FIG. 1 is a circuit diagram of an embodiment of the present invention using solid state SCR switches.
Figure 2:
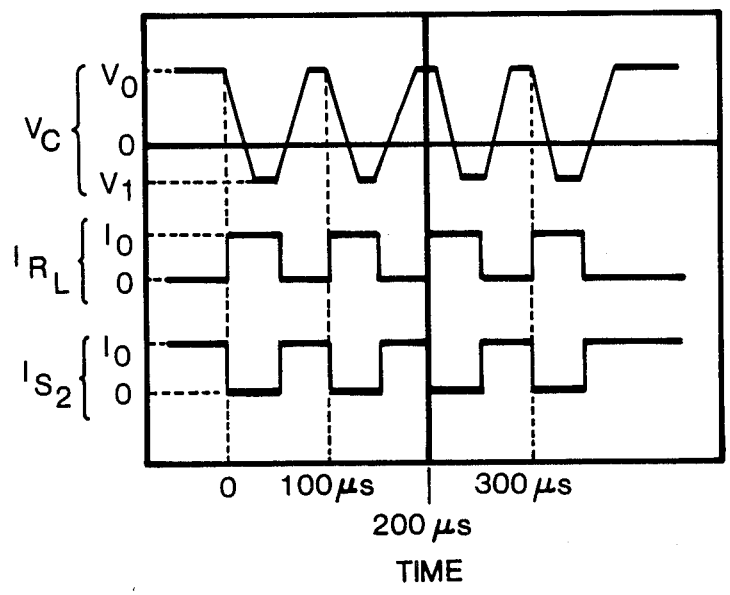
FIG. 2 is an illustration of waveforms associated with the circuit of FIG. 1.

The present invention may be implemented with silicon controlled rectifiers (SCR's), see FIG. 1. The SCR's $S_1$, $S_2$, $S_3$, and $S_4$ may be 2N3898's or higher powered units or combinations thereof depending upon the power requirements of the load $R_{LOAD}$. For very high power requirements, $S_1$–$S_4$ may be implemented with triggered vacuum gap (TVG) switches. Waveforms for the operation of the circuit of FIG. 1 are shown in FIG. 2. In both Figures, $I_{S2}$ is the current through main opening switch $S_2$, $I_{RL}$ is the current through the load $R_{LOAD}$ and $V_c$ is the voltage across capacitor C in the direction shown.

With the system in the storage mode (switches $S_1$ and $S_2$ closed), power supply PS has charged the storage inductor $L_1$ to a current level $I_O$, FIG. 2 (lower trace). The counterpulse capacitor C is charged to a voltage level $V_O$ by another external power supply (not shown). At $t=0$, the load switch $S_3$ closes and counterpulse capacitor C discharges through $R_{LOAD}$ and the main opening switch $S_2$. Therefore, both the load pulse and the current counterpulse of the main opening switch are initiated simultaneously. When the load pulse, FIG. 2 (middle trace), reaches the value of the storage current $I_O$ flowing through $S_2$, the main opening switch current is zero and $S_2$ opens. For large scale operation with triggered vacuum gap (TVG) switches for $S_1$–$S_4$, saturable reactors (not shown) would be needed in series with $S_2$ and the other TVGs to provide adequate current-zero time. The energy remaining in C when $S_2$ opens is transferred to $R_{LOAD}$ and $L_1$ as the coil current flows through $S_1$, C, $S_3$, and $R_{LOAD}$. The nearly-constant current flowing through C during the load pulse causes the voltage on C, FIG. 2 (upper trace), to reverse in a linear fashion. After the voltage on C has reversed to voltage $V_1$, switch $S_4$ is closed to bypass C and automatically counterpulse $S_1$ off. For the remainder of the load pulse, the coil current flows through $R_{LOAD}$ and switches $S_3$ and $S_4$. When the load pulse is terminated by reclosing $S_2$, the inverse voltage $V_1$ of C acts to counterpulse the load switch $S_3$, turning it off at current zero and forcing the transfer of any energy storage in the inductance of the load back to $L_1$. Counterpulsing the load off also produces a sharp, rapid cutoff of the load pulse, rather than allowing an exponential decay. An optional bypass diode $D_1$ may be used in parallel with any load resistance to reduce the voltage required on C to counterpulse $S_3$ off. With $S_3$ off, the storage current flows through $S_4$ and $S_2$ and in the reverse direction through C, causing C to recharge to its original initial condition $V_0$. When the voltage on C reaches $V_0$, C again has enough energy to perform the next counterpulse operation and $S_1$ is closed to bypass C and automatically counterpulse $S_4$ off. This returns the system to the storage mode and completes one full transfer cycle.

Repetitive operation occurs by repeating the complete transfer cycle just described. The waveforms of FIG. 2 show operation of the series counterpulse circuit at a current level of 25 A and at pulse repetition rate of 10 kpps. Note that the load current begins at the same time that the opening switch current is counterpulsed to zero and that the counterpulse capacitor C is recharged after each load pulse. The counterpulse operations at both the beginning and end of the load pulse provide sharp leading and trailing edges.

The power handling capabilities of the present invention described above may be greatly increased by using triggered vacuum switches (TVG's) for $S_1$–$S_4$. Using commercial TVG's such as the GE ZR-7512 or EG&G GPV-63, operation at 75 MW and a 5-kpps rate may be achieved.

Even greater power handling may be achieved with the present invention by incorporating better opening switches. A current-zero type opening switch with excellent high-power, high-repetition-rate potential is the rod-array, triggered-vacuum-gap (RATVG) switch developed for the Electric Power Research Institute for use in high-voltage transmission lines, see J. A. Rich, C. P. Goody, and J. C. Sofianek, "High Power Triggered Vacuum Gap of Rod Array Type," General Electric Report No. 81CRD321, Dec. 1981. The G1 tube described therein has been demonstrated capable of conducting an ac half-cycle current pulse of 150 kA (peak) and withstanding recovery voltage of 135 kV within 150 $\mu$s. This type of switch employed in the present invention would yield a repetitive pulse circuit capable of operating in the 100-kA, 100-kV and 1-kpps range. Output pulses in the megampere or megavolt range could then be generated with an output pulse transformer. Operation as such would raise the repetitive pulse power handling capability of the present invention to the 10-GW range.

The foregoing description of one preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A series-counterpulse repetitive-pulse inductive storage circuit comprising:
   a. a dc voltage source having a positive and a negative output;
   b. a load having a first and a second end, said first end thereof connected to said negative output of said dc voltage source;
   c. a storage coil having a first and a second end, said first end thereof connected to said positive output of said dc voltage source;
   d. a counterpulse capacitor having a first and a second end, said counterpulse capacitor initially forward charged to a final voltage;
   e. first unidirectional triggerable means connected between said second end of said storage coil and said first end of said counterpulse capacitor, said first unidirectional triggerable means for closing when said counterpulse capacitor is fully forward charged and for being counterpulsed off when the voltage on said counterpulse capacitor becomes reversed charged;

f. second unidirectional triggerable means connected between said first end of said counterpulse capacitor and said first end of said load, said second unidirectional triggerable means for initially being closed and for being counterpulsed off when current flowing through said load is equal to current flowing through said storage coil and for being triggered reclosed to terminate current flowing through said load;

g. third unidirectional triggerable means connected between said second end of said counterpulse capacitor and said second end of said load, said third unidirectional triggerable means for being triggered closed to initiate a current flow from said counterpulse capacitor through said second unidirectional triggerable means and said load, and for being counterpulsed off when said counterpulse capacitor is reversed charged, and said second unidirectional triggerable means is triggered reclosed; and h. fourth unidirectional triggerable means connected between said second end of said storage coil and said second end of said counterpulse capacitor, said fourth unidirectional triggerable means for closing when said counterpulse capacitor becomes reversed charged and for being counterpulsed off when said first unidirectional triggerable means is closed when said counterpulse capacitor is fully forward charged.

2. The series-counterpulse repetitive-pulse inductive storage circuit of claim 1 further including unidirectional means in parallel with the resistance of said load for reducing the reverse voltage across said counterpulse capacitor required to counterpulse said third unidirectional triggerable means off.

3. The invention of claim 2 wherein said unidirectional means includes a diode.

4. The invention of claim 3 wherein said diode is a solid-state diode.

5. The invention of claim 1 wherein at least one of said first, second, third and fourth unidirectional triggering means is a silicon controlled rectifier.

6. The invention of claim 2 wherein at least one of said first, second, third and fourth unidirectional triggering means is a silicon controlled rectifier.

* * * * *